Figure 1:
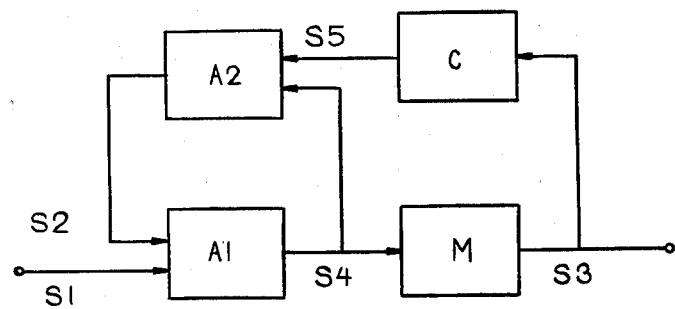

United States Patent [19]

Temer

[11] 4,178,555

[45] Dec. 11, 1979

[54] METHOD OF REDUCING DISTORTION IN ELECTRONIC NETWORKS

[76] Inventor: Vladan Temer, 1400 Fountain Grove Pkwy., Santa Rosa, Calif. 95404

[21] Appl. No.: 892,031

[22] Filed: Mar. 31, 1978

[51] Int. Cl.² .............................................. H03B 1/04
[52] U.S. Cl. .................................................. 328/162
[58] Field of Search ................. 328/162, 163; 179/1 P

[56] References Cited

U.S. PATENT DOCUMENTS 3,829,715   8/1974   Van Sluys .................... 328/162 X
3,938,050   2/1976   Corbett et al. ................... 328/163

*Primary Examiner*—John S. Heyman

[57] ABSTRACT

The method provides for reduction of distortion in the main channel of an electronic signal processing system by means of two summing networks and a control network. Distortion reduction is accomplished independently of the main channel's characteristics. One of the two summing networks as well as the control network can be made to be passive. Only under the provision that certain transfer characteristics of the two summing networks satisfy a prescribed relation can total elimination of distortion be achieved.

6 Claims, 1 Drawing Figure

METHOD OF REDUCING DISTORTION IN ELECTRONIC NETWORKS

This invention relates to distortion reduction in networks for the processing of electrical signals. Distortion is assumed to be any unwanted deviation from a prescribed transfer function. The method is applicable to audio amplifiers, amplifiers in general and other systems from which highly accurate signal processing is required. The most widely used method of error correction or distortion reduction in electronic networks is overall negative feedback. The operation of networks which employ negative feedback is highly dependent upon large open loop gain of the active devices used. It is only with infinite open loop gain that complete error correction can occur. Errors caused by crossover distortion in transistor amplifiers which use class B output stages are difficult to correct by means of overall negative feedback because, in the crossover region, the output stage has a low gain and behaves nonlinearly, thus giving rise to reduced loop gain and increased distortion. Another problem encountered in the use of negative feedback is instability. To make the system stable, the active device is compensated by limiting its bandwidth or reducing the open loop gain. This however limits the amount of error correction. In addition, if the open loop bandwidth of the circuit has been severely limited for the purpose of compensation, nonlinear distortion during transient periods can be introduced. Distortion mechanisms of this type are known as slew rate limiting and "transient intermodulation distortion". Another method of error correction is feed-forward. In networks like those of audio power amplifiers, feedforward error correction is difficult to use because of the requirements for low output impedance and high output current capability.

In the present invention, error correction is not accomplished by means of reduction in open loop gain which eliminates some of the problems encountered in negative feedback circuits. Also, the correction signal is not added directly to the output signal as in feedforward circuits. It is therefore the principal object of the invention to provide error correction the quality of which is in wide limits independent of the transfer function of the circuit whose errors are to be corrected.

A further object is to also achieve correction of errors which might result from loading at the output of the circuit so that the special cases of constant voltage and constant current operation at the output are more easily achievable.

It is another object to accomplish total, rather than just partial correction of errors which are created in the main channel.

FIG. 1 is a block diagram representation of the system. Referring to the drawing, S1 is the signal to be processed, also referred to as the input signal from now on. A correction signal S2 is combined with the input signal in the summing network A1. The output of the summing network A1 provides the driving signal S4 which is applied to the main channel M. The main channel is the network whose errors are to be corrected. The output of the main channel is at the same time the output of the system. The signal S3 at the output of the main channel is applied to the control network C. The inverse of the transfer function of the control network is related to the transfer function of the composite system. The signal S5 at the output of the control network is combined with the driving signal S4 in the summing network A2. The output of this second summing network is the correction signal S2 which was combined with the input signal S1 in the summing network A1 to provide the driving signal S4.

The transfer characteristic of the summing network A1 is, in general, $$S4 = P \cdot S1 + Q \cdot S2 \tag{1}$$

and that of the summing network A2 is $$S2 = R \cdot S4 + T \cdot S5 = R \cdot S4 + T \cdot C \cdot S3 \tag{2}$$

where P,Q,R,T and C are linear transfer functions, if the composite system is to behave linearly, and the equations are expressed in frequency domain notation. The conditions for total error correction and the transfer function of the composite system are obtained by substituting equation (1) into equation (2)

$$S2 = R(P \cdot S1 + Q \cdot S2) + T \cdot C \cdot S3 \tag{3}$$

If R, P and Q are linear transfer functions, equation (3) can be rewritten as $$S2 = R \cdot P \cdot S1 + R \cdot Q \cdot S2 + T \cdot C \cdot S3 \tag{4}$$

For total error correction, it is desired that in equation (4) the terms involving signals other than S1 or S3 vanish. This occurs when $$S2 = R \cdot Q \cdot S2 \tag{5}$$

so that the requirement for total elimination of distortion introduced by the main channel M is satisfied when $$R \cdot Q = 1 \tag{6}$$

Equation (4) then reduces to $$T \cdot C \cdot S3 = -R \cdot P \cdot S1 \tag{7}$$

and the transfer function of the composite system is $$F = S3/S1 = -R \cdot P / T \cdot C \tag{8}$$

The output of the system is independent of the main channel's characteristics. Further, if the condition $$R \cdot P / T = 1 \tag{9}$$

is met, the control network C alone determines the system's transfer function. The control network C may in general be a passive or an active circuit. If it is desired to obtain a system with a prescribed nonlinear transfer function, the control network C can be made to have a nonlinear transfer characteristic which is related to the system's desired characteristic.

The main channel M should, for best practical results, have a transfer function as similar as possible to the composite system's desired transfer function.

Should any loading at the output of the system cause a change in the signal S3, this would appear as an error in the main channel and it would be fully corrected.

From equation (6) it can be seen that either one of the transfer functions R and Q can be made to have a magnitude of less than one, provided that the other transfer function has a gain of more than one. Since the function Q belongs to the summing network A1 and the function R belongs to the summing network A2, either network A1 or A2 can be made as a passive circuit with the other then being active. A practical active summing network tends to introduce more errors than a passive one. Hence, it is advantageous to use only one active network rather than two.

If it is desired to obtain a noninverting system, the presence of at least one active summing network allows for the elimination of the negative sign from the transfer function in equation (8). In most practical cases it is not convenient to introduce a polarity reversal in the control network for the purpose of obtaining a noninverting system since the control network is usually realized as a passive signal scaling circuit.

The selection of suitable components and the realization of the electronic circuits for the system are within the skill of one in the art.

While the drawing shown in FIG. 1 is the most general representation of the system, it will be understood that the diagram can be modified to show specific features of the individual parts of the system without departing from the scope of the appended claims.

What is claimed is:

1. A method for the processing of electrical signals by means of an electronic system which comprises:
   a. a first summing network having a first and a second input and an output, the input signal to the system being applied to said first input of first summing network, a correction signal being applied to said second input of first summing network and the output signal of said first summing network being determined in the frequency domain by the equation $$S4 = P \cdot S1 + Q \cdot S2$$

with S4 being said output signal of first summing network, S1 being said input signal to the system, S2 being said correction signal and P and Q being linear transfer functions;
   b. a main channel having an input and an output, said input to main channel being connected to said output of first summing network and said output of main channel being the output of said system;
   c. a control network having an input, an output, and a transfer function C, said input to control network being connected to said output of main channel; and
   d. a second summing network having a first and a second input and an output, said first input to second summing network being connected to said output of control network, said second input to second summing network being connected to said output of first summing network, the signal at said output of second summing network being applied to said second input of first summing network, thereby functioning as said correction signal, and being determined in the frequency domain by the equation $$S2 = T \cdot S5 + R \cdot S4$$

with S2 being said correction signal, S5 being the signal at said first input to second summing network, S4 being said output signal of first summing network, T and R being linear transfer functions, and the relationship between said transfer functions R and Q being, in the frequency domain, $$R \cdot Q = 1$$

so as to achieve for said system an overall transfer function F which is independent of the transfer characteristics of said main channel and is determined in the frequency domain by the equation $$F = S3/S1 = -R \cdot P/T \cdot C$$

with S3 being the signal at said output of system, S1 being said input signal to the system, R, P, and T being said linear transfer functions, and C being said transfer function of control network and being equal in frequency domain to the ratio of said signal at output of control network to said signal at input of control network.

2. The method and system of claim 1 wherein said first summing network utilizes no active electrical network element and said second summing network utilizes at least one active electrical network element.

3. The method and system of claim 1 wherein said first summing network utilizes at least one active electrical network element and said second summing network utilizes no active electrical network element.

4. The method and system of claim 1 wherein said first summing network utilizes at least one active electrical network element and said second summing network utilizes at least one active electrical network element.

5. The method and system of claim 1 wherein the relationship among said transfer functions R, P, T, and C is such as to allow said system transfer function $$F = -R \cdot P/T \cdot C$$

to be written as $$F = K \cdot H$$

with K being a real constant and H being a frequency domain transfer function.

6. The method and system of claim 1 wherein at least one of said frequency domain equations $$S4 = P \cdot S1 + Q \cdot S2$$

$$S2 = T \cdot S5 + R \cdot S4$$

$$S5 = C \cdot S3$$

$$R \cdot Q = 1$$

$$F = -R \cdot P/T \cdot C$$

$$F = K \cdot H$$

is made to be satisfied, within an acceptable tolerance, only when the frequency content and amplitude of the signals concerned are within a range of interest.

* * * * *